United States Patent
Twitchen et al.

(10) Patent No.: US 7,910,083 B2
(45) Date of Patent: *Mar. 22, 2011

(54) COLOURED DIAMOND

(75) Inventors: Daniel James Twitchen, Sunningdale (GB); Philip Maurice Martineau, Littlewick Green (GB); Geoffrey Alan Scarsbrook, Ascot (GB); Barbel Susanne Charlotte Dorn, Bracknell (GB); Michael Andrew Cooper, Wokingham (GB)

(73) Assignee: Element Six Limited, Ballasalla (IM)

( * ) Notice: Subject to any disclaimer, the term of this patent is extended or adjusted under 35 U.S.C. 154(b) by 800 days.

This patent is subject to a terminal disclaimer.

(21) Appl. No.: 11/683,576

(22) Filed: Mar. 8, 2007

(65) Prior Publication Data

US 2007/0212543 A1 Sep. 13, 2007

Related U.S. Application Data

(63) Continuation of application No. 10/655,581, filed on Sep. 5, 2003, now abandoned, which is a continuation of application No. 10/318,111, filed on Dec. 13, 2002, now abandoned.

(30) Foreign Application Priority Data

Dec. 14, 2001 (GB) .................................. 0130004.5

(51) Int. Cl.
*C01B 31/06* (2006.01)
(52) U.S. Cl. ............................. 423/446; 117/929; 63/32
(58) Field of Classification Search .................. 423/446; 63/32; 117/929
See application file for complete search history.

(56) References Cited

U.S. PATENT DOCUMENTS

| | | | |
|---|---|---|---|
| 5,328,548 | A | 7/1994 | Tsuji et al. |
| 5,628,824 | A | 5/1997 | Vohra et al. |
| 7,172,655 | B2 | 2/2007 | Twitchen et al. |
| 2004/0177803 | A1 | 9/2004 | Scarsbrook et al. |
| 2004/0180205 | A1 | 9/2004 | Scarsbrook et al. |
| 2004/0182308 | A1 | 9/2004 | Scarsbrook et al. |
| 2004/0221795 | A1 | 11/2004 | Scarsbrook et al. |
| 2004/0229464 | A1 | 11/2004 | Godfried et al. |
| 2007/0079752 | A1 | 4/2007 | Twitchen et al. |

FOREIGN PATENT DOCUMENTS

| | | |
|---|---|---|
| CN | 1123847 A | 6/1996 |
| EP | 0 316 856 A1 | 5/1989 |
| EP | 0 324 179 A1 | 7/1989 |
| EP | 0 348 026 A1 | 12/1989 |
| EP | 0 589 464 A1 | 3/1994 |
| EP | 0 615 954 A1 | 9/1994 |
| EP | 0 715 885 A2 | 6/1996 |
| JP | 1-131014 | 5/1989 |
| JP | 6-107494 | 4/1994 |
| JP | 6-263418 | 9/1994 |
| JP | 7-277890 | 10/1995 |
| JP | 9-165295 | 6/1997 |
| JP | 11-1392 | 1/1999 |

OTHER PUBLICATIONS

Kania, P., et al., Diamond and Related Materials, vol. 4, pp. 425-428 (1995).
Samlenski, R., et al., Applied Physics Letters, vol. 67, No. 19, pp. 2798-2800 (1995).
Afzal, A., et al., Diamond and Related Materials, vol. 7, pp. 1033-1038 (1998).
Schermer, J.J., et al., Diamond and Related Materials, vol. 8, pp. 2127-2139 (1999).
Yan, et al., "Very high Growth Rate Chemical Vapor Deposition of Single-Crystal Diamond" in Proceedings of the Nat'l Academy of Sciences, vol. 99, No. 20, pp. 12523-12535 (Oct. 1, 2002).
P. Kania, et al., Diamond and Related Materials, vol. 4, pp. 425-428 (1995).
English translation of "Characterization of thick homoepitaxial film on diamond (001) substrate II".
English translation of "Homoepitaxial growth of diamond (001) with nitrogen doping".
J. Michler, et al., J. Appl. Phys., vol. 83, No. 1, pp. 187-197 (1998).
R. Locher, et al., Appl. Phys. Lett., vol. 65, No. 1, pp. 34-36 (1994).
I.I. Vlasov, et al., Phys. Stat. Sol, vol. (a)181, No. 83, pp. 83-90 (2000).
P.E. Pehrsson, et al., Mat. Res. Soc. Symp, Proc., vol. 416, pp. 51-56 (1996).
U.S. Appl. No. 12/245,002, filed Oct. 3, 2008, Scarsbrook, et al.
U.S. Appl. No. 12/416,216, filed Apr. 1, 2009, Twitchen, et al.
T. Tsuno, et al., "Characterization of Thick Homoepitaxial Film on Diamond (001) Substrate II", JNDF 9th Diamond Symposium, Abstracts, pp. 60-61 (with English translation) (Nov. 21, 1995).
T. Tsuno, et al., "Homoepitaxial growth of diamond (001) with nitrogen doping", Extended Abstracts (The 56th Autumn Meeting, 1995); The Japan Society of Applied Physics, No. 2, p. 377 (with English translation) (Aug. 26, 1995).

*Primary Examiner* — Stuart Hendrickson
(74) *Attorney, Agent, or Firm* — Oblon, Spivak, McClelland, Maier & Neustadt, L.L.P.

(57) ABSTRACT

A diamond layer of single crystal CVD diamond which is coloured, preferably which has a fancy colour, and which has a thickness of greater than 1 mm.

35 Claims, 9 Drawing Sheets

COLOURED DIAMOND

BACKGROUND OF THE INVENTION

This invention relates to a method of producing by chemical vapour deposition (hereinafter referred to as CVD) coloured single crystal diamond, and in one aspect a method of producing fancy coloured diamonds these coloured diamonds being suitable, for example, for preparation for ornamental purposes or applications in which colour is a secondary parameter that may influence market acceptance.

Intrinsic diamond has an indirect band gap of 5.5 eV and is transparent in the visible part of the spectrum. Introducing defects or colour centres, as they will be called, which have associated energy levels within the band gap gives the diamond a characteristic colour which is dependent on the type and concentration of the colour centres. This colour can result from either absorption of photoluminescence or some combination of these two. One example of a common colour centre present in synthetic diamond is nitrogen which, when sitting on a substitutional lattice site in the neutral charge state, has an associated energy level ~1.7 eV below the conduction band—the resulting absorption gives the diamond a characteristic yellow/brown colour.

Methods of depositing material such as diamond on a substrate by CVD are now well established and have been described extensively in the patent and other literature. Where diamond is being deposited on a substrate, the method generally involves providing a gas mixture which, on dissociation, can provide hydrogen or a halogen (e.g. F,Cl) in atomic form and C or carbon-containing radicals and other reactive species, e.g. $CH_x$, $CF_x$ wherein x can be 1 to 4. In addition, oxygen containing sources may be present, as may sources for nitrogen, and for boron. Nitrogen can be introduced in the synthesis plasma in many forms; typically these are $N_2$, $NH_3$, air and $N_2H_4$. In many processes inert gases such as helium, neon or argon are also present. Thus, a typical source gas mixture will contain hydrocarbons $C_xH_y$ wherein x and y can each be 1 to 10 or halocarbons $C_xH_yHal_z$ wherein x and z an each be 1 to 10 and y can be 0 to 10 and optionally one or more of the following; $CO_x$, wherein x can be 0.5 to 2, $O_2$, $H_2$, $N_2$, $NH_3$, $B_2H_6$ and an inert gas. Each gas may be present in its natural isotopic ratio, or the relative isotopic ratios may be artificially controlled; for example hydrogen may be present as deuterium or tritium, and carbon may be present as $^{12}C$ or $^{13}C$. Dissociation of the source gas mixture is brought about by an energy source such as microwaves, RF (radio frequency) energy, a flame, a hot filament or jet based technique and the reactive gas species so produced are allowed to deposit onto a substrate and form diamond.

CVD diamond may be produced on a variety of substrates. Depending on the nature of the substrate and details of the process chemistry, polycrystalline or single crystal CVD diamond may be produced.

It is well known that post growth treatment such as irradiation with sufficiently energetic particles (electron, neutron etc) to produce lattice defects (interstitials and vacancies) and suitable annealing can result in the formation of colour centres, such as the nitrogen vacancy [N-V] colour centre, which can give the diamond a desirable colour (see for example EP 0 615 954 A1, EP 0 326 856 A1 and the references cited therein). Further characteristics and artificial production of colour centres are discussed in detail by John Walker in the Reports on Progress in Physics, Vol. 42 1979. The artificial production method of colour centres outlined therein comprises the steps of forming lattice defects in crystals by electron beam irradiation and, if necessary annealing to cause the lattice defects to combine with nitrogen atoms contained in the crystals. However, there are limitations to the colours and uniformity that can be produced as a consequence of competitive defect formation and because of the strong sector dependence associated with defects such as nitrogen in diamond.

The colour of a diamond produced by utilising this post growth colour centre formation method is the colour of the rough diamond combined with the colour of the colour centre produced. In order to obtain the ornamental value desired, and thus achieve a combination of high transparency and fancy colour, it has been usual practice to use diamonds that were initially either transparent or light yellow.

There are three visual attributes to colour: hue, lightness and saturation. Hue is the attribute of colour that allows it to be classified as red, green, blue, yellow, black or white, or a hue that is intermediate between adjacent pairs or triplets of these basic hues (Stephen C. Hofer. Collecting and Classifying Coloured Diamonds, 1998, Ashland Press, New York).

White, grey and black objects are differentiated on a lightness scale of light to dark. Lightness is the attribute of colour that is defined by the degree of similarity with a neutral achromatic scale starting with white and progressing through darker levels of grey and ending with black.

Saturation is the attribute of colour that is defined by the degree of difference from an achromatic colour of the same lightness. It is also a descriptive term corresponding to the strength of a colour. The diamond trade uses adjectives such as intense, strong and vivid to denote different degrees of saturation assessed visually. In the CIELAB colour system, saturation is the degree of departure from the neutral colour axis (defined by saturation=$[(a^*)^2+(b^*)^2]^{1/2}$, see hereinafter). Lightness is a visual quality perceived separately from saturation.

The dominant colour of much of the diamond of the invention described hereinafter is brown. Brown is generally a darker, less saturated version of orange. As brown becomes lighter and more saturated it becomes orange. Brown colours also underlie a portion of the yellow hue family so that orange-yellow and orangish yellows in their darker and weaker variants may fall into the brown region.

For diamonds, intermediate colour descriptions between brown and orange are used. In order of decreasing browness and increasing orangeness, the description of the colour goes through the following sequence: brown, orangish brown, orange-brown, brown-orange, brownish orange, orange. Similar sequences apply for the transitions from brown to orange-yellow or orangish yellow. In three-dimensional colour space the region of brown colours is also bordered by pink colour regions and on moving from brown to pink the following sequence is followed: brown, pinkish brown, pink-brown, brown-pink, brownish pink, pink.

Fancy coloured diamonds are diamonds with an obvious and unusual colour. When the dominant component of that colour is brown they are described as fancy brown. This term covers a complex range of colours, defined by a three dimensional region of colour space. It covers large ranges in the values of lightness, hue and saturation.

The inherent colour of a cut diamond, sometimes called the body colour, can best be judged if the diamond is viewed from the side for typical cuts. The apparent colour seen in the face-up direction (ie looking towards the table) can be greatly affected by the cut of the stone because of the effect that this has on the path length within the stone for the light subsequently reaching the eye. For example, inherently orange-brown diamond can be cut in such a way that its face-up colour appears brighter, resulting in a reversal of the dominant colour to brown-orange.

SUMMARY OF THE INVENTION

According to a first aspect of the invention, there is provided a coloured single crystal diamond layer, preferably a fancy coloured single crystal diamond layer, and more preferably a fancy coloured single crystal diamond layer where brown is the dominant colour, synthesised by CVD and prepared or suitable for preparation as a cut stone for ornamental application or for other applications where colour may influence market acceptance. The CVD diamond layer of the invention preferably has a hue angle of less than 80°, preferably a hue angle of less than 75° and more preferably a hue angle of less than 70°. The hue angle for a particular hue can be found by extending the line back from the point representing that hue on the a* b* colour plot as described more fully hereinafter, and shown on FIG. 3.

The CVD diamond layer of the invention has a thickness greater than 1 mm, and preferably greater than 2 mm and more preferably greater than 3 mm.

The CVD diamond layer of the invention may also have one or more of the following characteristics (i) (ii) and (iii) observable in the majority volume of the layer, where the majority volume comprises at least 55%, and preferably at least 80%, and more preferably at least 95% of the whole volume of the layer. Preferably the majority volume of the layer is formed from a single growth sector.

(i) The majority volume of the CVD diamond layer contains one or more of the defect and impurity related colour centres that contribute to the absorption spectrum of the diamond as set out in the absorption coefficient column of the table below:

(ii) The majority volume of the CVD diamond layer contains defect and impurity related centres that contribute to the luminescence spectrum as detailed in the normalised luminenscence intensity column of the table below, when measured in the prescribed manner using Ar ion 514 nm laser excitation at 77K and normalised relative to the Raman scattering intensity:

| Designation | Starts | Ends | Peak | Normalised luminescence intensity of zero phonon line at 77K |
|---|---|---|---|---|
| 575 nm | 570 nm | 680 nm | 575 nm | 0.02-80 |
| | | | preferably | 0.05-60 |
| | | | more preferably | 0.2-40 |
| 637 nm | 635 nm | 800 nm | 637 nm | 0.01-300 |
| | | | preferably | 0.02-200 |
| | | | more preferably | 0.03-100 |

(iii) The majority volume of the CVD diamond layer exhibits a ratio of normalised 637 nm/575 nm luminescence, measured in the manner described herein, which is in the range 0.2-10, and preferably in the range 0.5-8, and more preferably in the range 2-5.

The present invention provides, according to another aspect, coloured single crystal CVD diamond which has a low ramp value as defined above in combination with a defect and impurity related colour centre that contributes to the absorption spectrum of the diamond at one or more of 270 nm, 350 nm band, 510 nm band and 570/637 nm, as set out in the table forming part of characteristic (i). The low ramp value in combination with one or more of the absorption spectrum characteristics provides the diamond with a desirable colour. The diamond will generally be in layer form. The thickness of the layer may range from a few microns to several mm in thickness.

The present invention provides a coloured single crystal CVD diamond which is desirable. A particular aspect of the invention is the provision of fancy coloured diamond suitable to produce gemstones, the term fancy referring to a gem trade classification of stronger and more unusual colours in diamond. Even more particularly the invention can provide a range of fancy brown colours, an example being fancy light pink brown. This invention further provides for a thick (>1 mm) diamond layer with uniform properties through its thick-

| Designation | Starts | Ends | Peak | Absorption coefficient (at peak) | |
|---|---|---|---|---|---|
| 270 nm | 220 nm | 325 nm | 270 nm | | $0.1\ cm^{-1}$-$30\ cm^{-1}$ |
| | | | | preferably | $0.4\ cm^{-1}$-$10\ cm^{-1}$ |
| | | | | more preferably | $0.8\ cm^{-1}$-$6\ cm^{-1}$ |
| 350 nm band | 270 nm | 450 nm | 350 nm +/− 10 nm | | $0.3\ cm^{-1}$-$20\ cm^{-1}$ |
| | | | | preferably | $1.0\ cm^{-1}$-$8\ cm^{-1}$ |
| | | | | more preferably | $1.5\ cm^{-1}$-$6\ cm^{-1}$ |
| 510 nm band | 420 nm | 640 nm | 510 nm +/− 50 nm | | $0.1\ cm^{-1}$-$10\ cm^{-1}$ |
| | | | | preferably | $0.2\ cm^{-1}$-$4\ cm^{-1}$ |
| | | | | more preferably | $0.4\ cm^{-1}$-$2\ cm^{-1}$ |
| 570/637 nm | 500 nm | 640 nm | 570 nm | | $0.1\ cm^{-1}$-$5\ cm^{-1}$ |
| | | | | preferably | $0.3\ cm^{-1}$-$3\ cm^{-1}$ |
| | | | | more preferably | $0.3\ cm^{-1}$-$1.5\ cm^{-1}$ |

| Designation | Form of Curve | Absorption Coefficient | |
|---|---|---|---|
| Ramp | Rising background of form Absorption coefficient $(cm^{-1}) = C \times \lambda^{-3}$ (C = constant, $\lambda$ in $\mu m$) | Contribution at 510 nm is: | $<3\ cm^{-1}$ |
| | | preferably | $<1.5\ cm^{-1}$ |
| | | more preferably | $<0.8\ cm^{-1}$ | ness so that any desirable colour is not quenched or hidden by defects related to low crystalline quality. The fanciness of the colours was originally not anticipated, nor the degree to which they could be controlled by choosing appropriate synthesis and substrate conditions. No post growth treatment is needed to produce these colours. In fact many of these colours are impossible to produce using post growth treatments, as a consequence of the relative colour centre formation mechanisms that compete during irradiation and annealing. In addition characteristics associated with the CVD growth mechanism can result in absorption bands at ~350 nm and ~510 nm. These are important for the final colour produced, but the centres responsible are not present in natural or other synthetic diamond. Consequently the colours achieved are unique to CVD diamond, and more particularly to CVD diamond of the invention.

Further, there is no post growth treatment as the colour centres are introduced by a careful selection of growth conditions. There are many reports in the literature of homoepitaxial CVD growth on high pressure high temperature (HPHT) synthetic and natural diamond substrates. Although there are only a few reports of thick layers (>100 μm), these tend to have an unattractive brown colour which results mainly from absorption related to low crystalline quality defects and graphitic/metallic inclusions and which tend to increase with growth thickness. Even if growth conditions were chosen to allow incorporation of colour centres that would give the diamond a desirable colour, this desirable colour would be masked by the dominant absorption relating to the low quality nature of the diamond crystal structure.

In addition, the majority volume of the CVD diamond layer of the invention may exhibit one or more of the following properties:

1. High crystalline quality as determined by a low density of extended defects, related factors such as narrow Raman line width, relatively featureless X-ray topography and narrow rocking curve, mechanical integrity, strength and mechanical processability of the material to form highly polished surfaces and edges. In this context high quality excludes quality factors normally requiring the absence of N, including features such as: the N impurities themselves and also associated point defects including H related defects and vacancies, electronic based properties such as mobility and charge collection distance which are very sensitive to scattering centres and traps, and the specific optical absorption and luminescence characteristics induced by the presence of the added nitrogen and the associated defects.
2. A level of any single impurity: Fe, Si, P, S, Ni, Co, Al, Mn of not greater than 1 ppm and a total impurity content of not greater than 5 ppm. In the above, "impurity" excludes hydrogen and its isotopic forms.
3. In EPR, a spin density $<1\times10^{17}$ cm$^{-3}$ and more typically $<5\times10^{16}$ cm$^{-3}$ at g=2.0028. In single crystal diamond this line at g=2.0028 is related to lattice defect concentrations and is typically large in natural type IIa diamond, in CVD diamond plastically deformed through indentation, and in poor quality homoepitaxial diamond.
4. X-ray topography showing features related to growth where <100> edges of the original substrate are grown out to form <110> edges.

The coloured CVD diamond layer of the invention may be on a surface of a substrate, typically a diamond substrate, and will generally be a free standing layer. A gemstone can be produced from the composite CVD diamond layer/diamond substrate or from the free standing layer.

The coloured single crystal CVD diamond of the invention may be made by a method that forms yet another aspect of the invention. This method includes the steps of providing a diamond substrate having a surface which is substantially free of crystal defects, providing a source gas, dissociating the source gas to produce a synthesis atmosphere which contains 0.5 to 500 ppm nitrogen, calculated as molecular nitrogen, and allowing homoepitaxial diamond growth on the surface which is substantially free of crystal defects.

In the method of the invention, the source gas which is used to produce the synthesis atmosphere in which homoepitaxial growth on the diamond substrate occurs contains a suitable amount of nitrogen. The nitrogen may be included in the source gas or added to a source gas which contains substantially no nitrogen. The nitrogen, either in the source gas or added to the source gas, must be such as to produce a synthesis atmosphere which contains 0.5 to 500 ppm, preferably 1 to 100 ppm of nitrogen, calculated as molecular nitrogen. The nitrogen in the source gas or added to it may be molecular nitrogen or a nitrogen containing gas such as ammonia.

The nitrogen in the synthesis atmosphere or plasma, in addition to producing colour centres in the diamond, can be used beneficially to cause morphological changes to the growing single crystal CVD diamond. Specifically, the addition of nitrogen to the gas phase can be used to enhance the size of the {100} growth sector and reduce the size of competing growth sectors such as the {111}. This means that, for growth on a {100} plate, the addition of nitrogen enables the growth to remain substantially {100} growth sector.

Coloured gemstones and more particularly fancy coloured gemstones may be produced from the CVD diamond of the invention and CVD diamond produced by the method described above. Such gemstones may be of high quality. In gem quality grading, one of the four key quality parameters is the clarity of the diamond gemstone. The clarity grades used are generally those defined by the GIA (Gemological Institute of America) and run on a scale from FL (flawless), IF, VVS1 (very very slightly included), VVS2, VS1 (very slightly included), VS2, SI1 (slightly included), SI2, I1 (imperrect), I2 and I3.

DETAILED DESCRIPTION OF THE INVENTION

Absorption Spectroscopy of Homoepitaxial CVD Diamond

Figure 1:
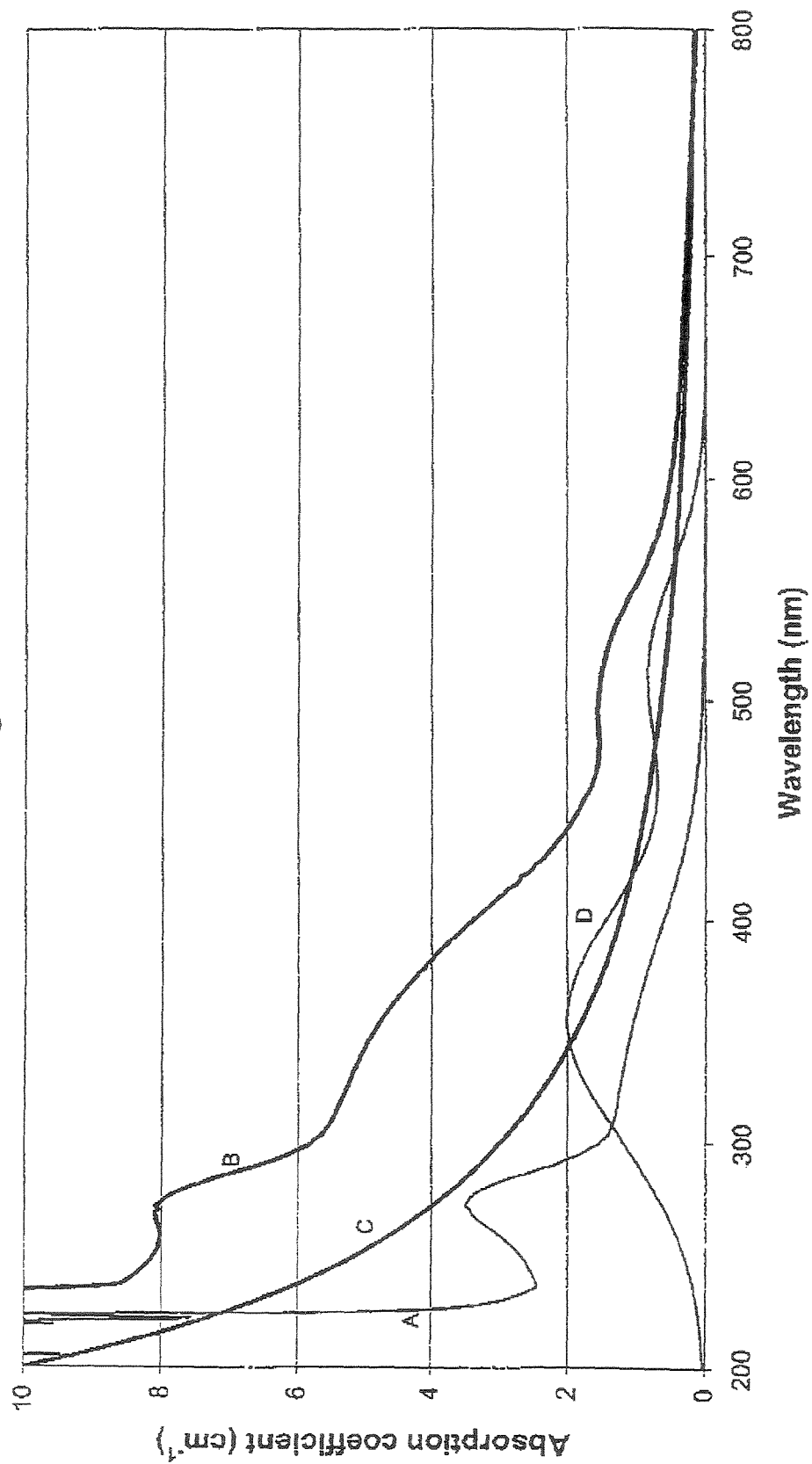
FIG. 1 Spectral decomposition of UV/visible absorption spectrum of an orangish brown CVD diamond layer
  Spectrum A: Type Ib HPHT synthetic diamond
  Spectrum B: Original spectrum of orangish brown CVD diamond
  Spectrum C: Spectral component with (wavelength)$^{-3}$ dependence
  Spectrum D: Spectral component composed of two broad absorption bands
FIG. 2 UV/visible absorption spectra for a set of brown CVD layers
FIG. 3 CIELAB a*b* diagram for brown CVD diamond
FIG. 4 CIELAB L*C* diagram for brown CVD diamond
FIG. 5 CIELAB a*b* plot for diamond layers grown in different kinds of CVD process
FIG. 6 CIELAB L*C* plot for diamond layers grown in different kinds of CVD process
FIG. 7 Spectral decomposition of UV/visible spectrum of FN-1
  Spectrum A: FN-1
  Spectrum B: Type Ib HPHT synthetic diamond
  Spectrum C: Spectral component with (wavelength)$^{-3}$ dependence Spectrum D: Spectral component composed of two broad absorption bands FIG. 8 CIELAB a*b* diagram from FN-1

The UV/visible absorption spectrum of type Ib diamond contains features associated with single substitutional nitrogen These include an absorption coefficient maximum at 270 nm and, to longer wavelengths, a gradual decrease in absorption coefficient between approximately 300 nm and 500 nm, with signs of a broad absorption band at approximately 365 nm. These features can be seen in absorption spectra of a type Ib high pressure high temperature diamond such as spectrum A in FIG. 1. Although the effect of single substitutional nitrogen on the absorption spectrum is greatest in the ultra-violet, it is the weaker absorption that extends into the visible region of the spectrum that affects the colour of the type Ib diamond and gives it a characteristic yellow/brown colour. This particular colour when strong and displaying the brown element is generally judged to be undesirable in a gemstone.

The UV/visible absorption spectrum of homoepitaxial CVD diamond doped with nitrogen typically contains a contribution from single substitutional nitrogen with the spectral characteristics described above. In addition to single substitutional nitrogen, nitrogen doped homoepitaxial CVD diamond typically contains some nitrogen in the form of nitrogen vacancy centres. When the N-V centre is electrically neutral $[N-V]^0$ it gives rise to absorption with a zero phonon line at 575 nm. When the N-V centre is negatively charged $[N-V]^-$ it gives rise to absorption with a zero-phonon line at 637 nm and an associated system of phonon bands with an absorption maximum at approximately 570 nm. At room temperature, the normal temperature for observation of gemstones, the absorption bands of these two charge states of the N-V centre merge into a broad band from about 500 nm-640 nm. This absorption band is in the yellow part of the visible spectrum, and when it is strong the crystals can exhibit a complementary pink/purple colour. This absorption can play an important part in determining the colour of the diamond of this invention.

The UV/visible absorption spectra of low quality homoepitaxial CVD diamond, show a gradual rise in measured absorption from the red to the blue region of the spectrum and into the ultra-violet. There may also be contributions from scattering. The spectra generally contain no other features, apart from those related to single substitutional nitrogen. This absorption spectrum gives an undesirable brown colour and such diamond often contains clearly visible graphitic inclusions. Such diamond is unsuitable as a gemstone material for these reasons and because it cannot in general be grown to substantial thicknesses without severe degradation of the crystal quality.

The coloured single crystal CVD diamond of the invention is of high crystalline quality and is substantially free of extended crystal defects and defects that tend to degrade the colour. The absorption spectrum of the nitrogen-doped diamond of the current invention contains additional contributions that are not present in natural, HPHT synthetic diamond or low quality CVD diamond. These include two broad bands centred at approximately 350 nm and 510 nm. The band at approximately 350 nm is distinct from the broad feature in that region of the spectrum of ordinary type Ib spectrum and distorts the spectrum of ordinary type Ib diamond to an extent dependent on the concentration of the centre responsible relative to the single substitutional nitrogen.

Similarly the band centred at approximately 510 nm can overlap absorption relating to negative nitrogen-vacancy centres and the visible absorption relating to single substitutional nitrogen.

The overlapping of the various contributions to the absorption spectra can cause the bands at approximately 350 and 510 nm to give rise to broad shoulders in the absorption spectrum rather than distinct maxima. These contributions to absorption do however have a very significant effect on the relative absorption coefficients of the diamond at wavelengths in the spectral region between 400 and 600 nm where the eye is very sensitive to small differences. They therefore make an important contribution to the perceived colour of the diamond. Together with the luminescence characteristics noted below, these absorption characteristics can give diamond gemstones produced from such diamond desirable fancy brown colours, including fancy dark browns orange brown and pink brown.

The width and position in the spectrum of these bands can vary. The position of peak maxima is most easily ascertained by using the second differential of the spectrum. It has been found that absorption spectra can generally be deconstructed into the following approximate components.

1) Single substitutional nitrogen component with an absorption coefficient at 270 nm that is generally within the range 0.4 $cm^{-1}$ and 10 $cm^{-1}$ and an absorption coefficient at 425 nm that generally lies between 0.04 $cm^{-1}$ and 1 $cm^{-1}$.

2) An absorption band centred at 3.54 eV (350 nm)+/−0.2 eV with a FWHM of approximately 1 eV and a maximum contribution to the absorption spectrum generally between 1 and 8 $cm^{-1}$ at its centre.

3) absorption band centred at 2.43 eV (510 nm)+/−0.4 eV with a FWHM of approximately 1 eV and a maximum contribution to the absorption spectrum generally between 0.2 and 4 $cm^{-1}$ at its centre.

4) A small residual wavelength dependent component of the measured absorption coefficient (in $cm^{-1}$) that is found to have a wavelength dependence of the following approximate form; $c \times (wavelength\ in\ microns)^{-3}$ where $C<0.2$ such that the contribution of this component at 510 nm is generally less than 1.5 $cm^{-1}$.

FIG. 1 shows the absorption spectrum of a brown CVD diamond layer (curve B) and the components into which it can be decomposed. The first step in such a spectral decomposition is the subtraction of the spectrum of a type Ib HPHT synthetic diamond (curve A), scaled so that the residual shows no 270 nm feature. The residual spectrum can then be decomposed into a $c \times \lambda^{-3}$ component (curve C) and two overlapping bands of the kind described above (curve D).

It has been found that the form of UV/visible spectra of CVD diamond grown using a range of different processes can be well specified by sums of the components described above, with different weighting factors for the components in different cases. For the purposes of specifying the shape of the spectrum the contributions of the different components are given in the following ways.

270 nm: The peak 270 nm absorption coefficient of the type Ib component is measured from a sloping baseline connecting the type Ib spectrum either side of the 270 nm feature that extends over the approximate range 235 nm-325 nm.

350 nm band: The peak absorption coefficient contribution of this band.

510 nm band: The peak absorption coefficient contribution of this band.

Ramp: The contribution of the $c\times\lambda^{-1}$ component to the absorption coefficient at 510 nm CIELAB Chromaticity Coordinate Derivation The perceived colour of an object depends on the transmittance/absorbance spectrum of the object, the spectral power distribution of the illumination source and the response curves of the observer's eyes. The CIELAB chromaticity coordinates quoted in this patent application have been derived in the way described below. Using a standard D65 illumination spectrum and standard (red, green and blue) response curves of the eye (G. Wyszecki and W. S. Stiles, John Wiley, New York-London-Sydney, 1967) CIE L*a*b* chromaticity coordinates of a parallel-sided plate of diamond have been derived from its transmittance spectrum using the relationships below, between 350 nm and 800 nm with a data interval of 1 nm:

$S_\lambda$=transmittance at wavelength $\lambda$
$L_\lambda$=spectral power distribution of the illumination
$x_\lambda$=red response function of the eye
$y_\lambda$=green response function of the eye
$z_\lambda$=blue response function of the eye $$X=\Sigma_\lambda[S_\lambda x_\lambda L_\lambda]/Y_0$$

$$Y=\Sigma_\lambda[S_\lambda y_\lambda L_\lambda]/Y_0$$

$$Z=\Sigma_\lambda[S_\lambda z_\lambda L_\lambda]/Y_0$$

Where $Y_0=\Sigma_\lambda y_\lambda L_\lambda$ $$L^*=116(Y/Y_0)^{1/3}-16=\text{Lightness (for } Y/Y_0>0.008856)$$

$$a^*=500[(X/X_0)^{1/3}-(Y/Y_0)^{1/3}] \text{ (for } X/X_0>0.008856, Y/Y_0>0.008856)$$

$$b^*=200[(Y/Y_0)^{1/3}-(Z/Z_0)^{1/3}] \text{ (for } Z/Z_0>0.008856)$$

$$C^*=(a^{*2}+b^{*2})^{1/2}=\text{saturation}$$

$$h_{ab} \arctan(b^*/a^*)=\text{hue angle}$$

Modified versions of these equations must be used outside the limits of $Y/Y_0$, $X/X_0$ and $Z/Z_0$. The modified versions are given in a technical report prepared by the Commission Internationale de L'Eclairage (Colorimetry (1986)).

It is normal to plot a* and b* coordinates on a graph with a* corresponding to the x axis and b* corresponding to the y axis. Positive a* and b* values correspond respectively to red and yellow components to the hue. Negative a* and b* values correspond respectively to green and blue components. The positive quadrant of the graph then covers hues ranging from yellow through orange to red, with saturations (C*) given by the distance from the origin.

It is possible to predict how the a*b* coordinates of diamond with a given absorption coefficient spectrum will change as the optical path length is varied. In order to do this, the reflection loss must first be subtracted from the measured absorbance spectrum. The absorbance is then scaled to allow for a different path length and then the reflection loss is added back on. The absorbance spectrum can then be converted to a transmittance spectrum which is used to derive the CIELAB coordinates for the new thickness. In this way the dependence of the hue, saturation and lightness on optical path length can be modelled to give an understanding of how the colour of diamond with given absorption properties per unit thickness will depend on the optical path length.

L*, the lightness forms the third dimension of the CIELAB colour space. It is important to understand the way in which the lightness and saturation vary as the optical path length is changed for diamond with particular optical absorption properties. This can be illustrated on a colour tone diagram in which L* is plotted along the y-axis and C* is plotted along the x-axis (such as FIG. 4). The method described in the preceding paragraph can also be used to predict how the L*C* coordinates of diamond with a given absorption coefficient spectrum depend on the optical path length.

The C* (saturation) numbers can be divided into saturation ranges of 10 C* units and assigned descriptive terms as below.

| | |
|---|---|
| 0-10 | weak |
| 10-20 | weak-moderate |
| 20-30 | moderate |
| 30-40 | moderate-strong |
| 40-50 | strong |
| 50-60 | strong-very strong |
| 60-70 | very strong |
| 70-80+ | very very strong |

Similarly the L* numbers can be divided up into lightness ranges as follows:

| | |
|---|---|
| 5-15 | very very dark |
| 15-25 | very dark |
| 25-35 | dark |
| 35-45 | medium/dark |
| 45-55 | medium |
| 55-65 | light/medium |
| 65-75 | light |
| 75-85 | very light |
| 85-95 | very very light |

There are four basic colour tones defined by the following combinations of lightness and saturation:

Bright: Light and high saturation, Pale: Light and low saturation,

Deep: High saturation and dark, Dull: Low saturation and dark.

Figure 2:
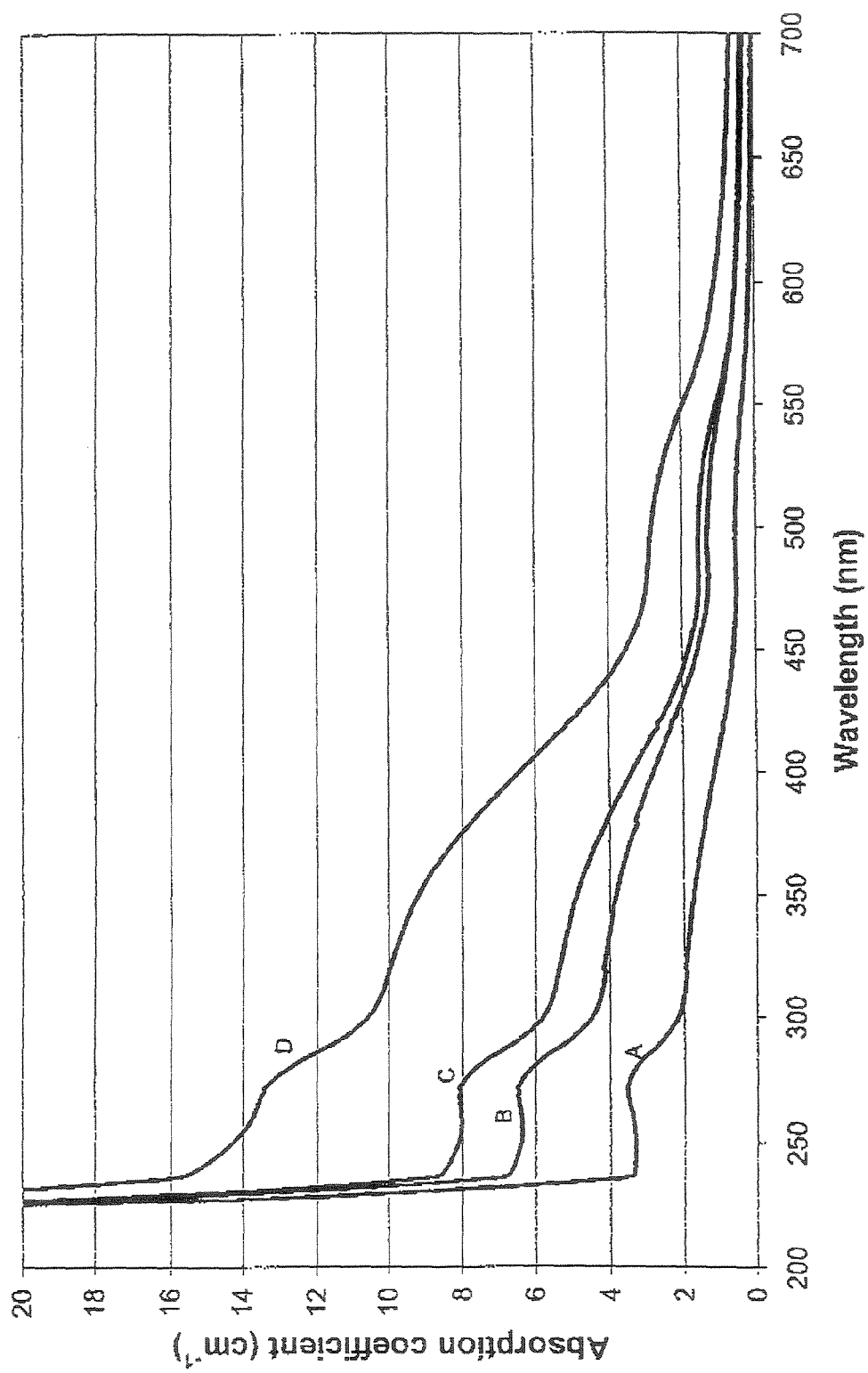

FIG. 2 shows absorption spectra for four samples with orangish brown to orange-brown colour and grown to 1.7 mm thickness with differing growth conditions. These spectra have similar shapes but display a range of different absorption strengths. Thus, by altering the growth conditions, it is possible to tune the strength of absorption to achieve different colours for a given thickness of CVD layer. Similarly for a gemstone produced with a given size and cut, the colour can be tuned by altering the growth conditions.

The table below lists the strengths of the different contributions to the four spectra shown in FIG. 2, defined in the way described earlier, together with the CIELAB information derived from the spectra. The hue angle, as given earlier, is defined as $h_{ab}$=arcitan (b*/a*).

Table of Absorption Contributions and CIELAB Values

| Spectrum | A | B | C | D |
|---|---|---|---|---|
| 270 nm band (cm$^{-1}$) | 0.93 | 1.3 | 1.6 | 1.6 |
| 350 nm band (cm$^{-1}$) | 0.45 | 1.5 | 2.0 | 4.0 |
| 510 nm band (cm$^{-1}$) | 0.3 | 0.6 | 0.8 | 1.2 |
| Ramp (cm$^{-1}$) | 0.19 | 0.46 | 0.60 | 1.26 |
| a* | 1.2 | 1.7 | 2.7 | 4.0 |
| b* | 2.8 | 6.4 | 7.9 | 14.5 |
| C* | 3.0 | 6.7 | 8.3 | 15 |
| L* | 84 | 82 | 79 | 72 |
| Hue angle (degrees) | 68 | 75 | 71 | 75 |

Figure 3:
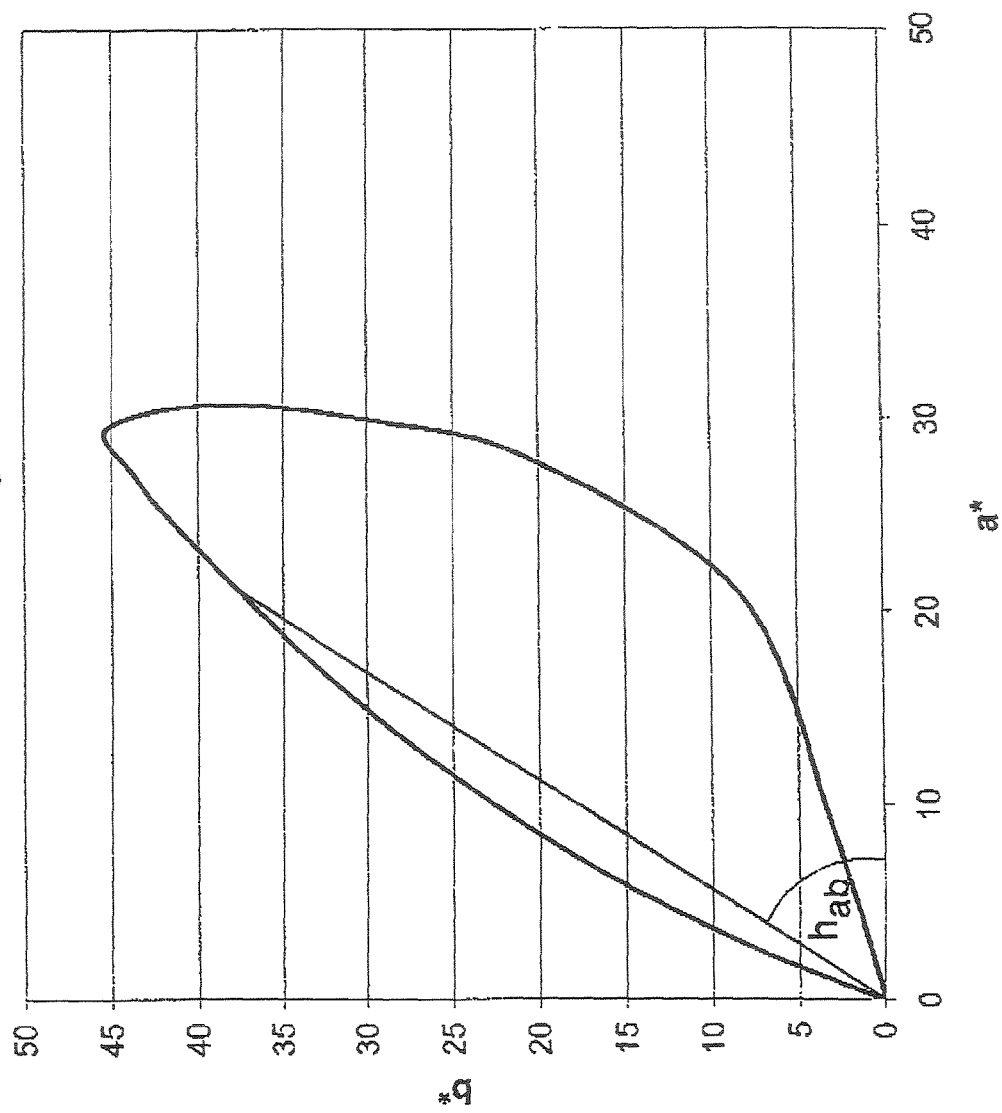
Figure 4:
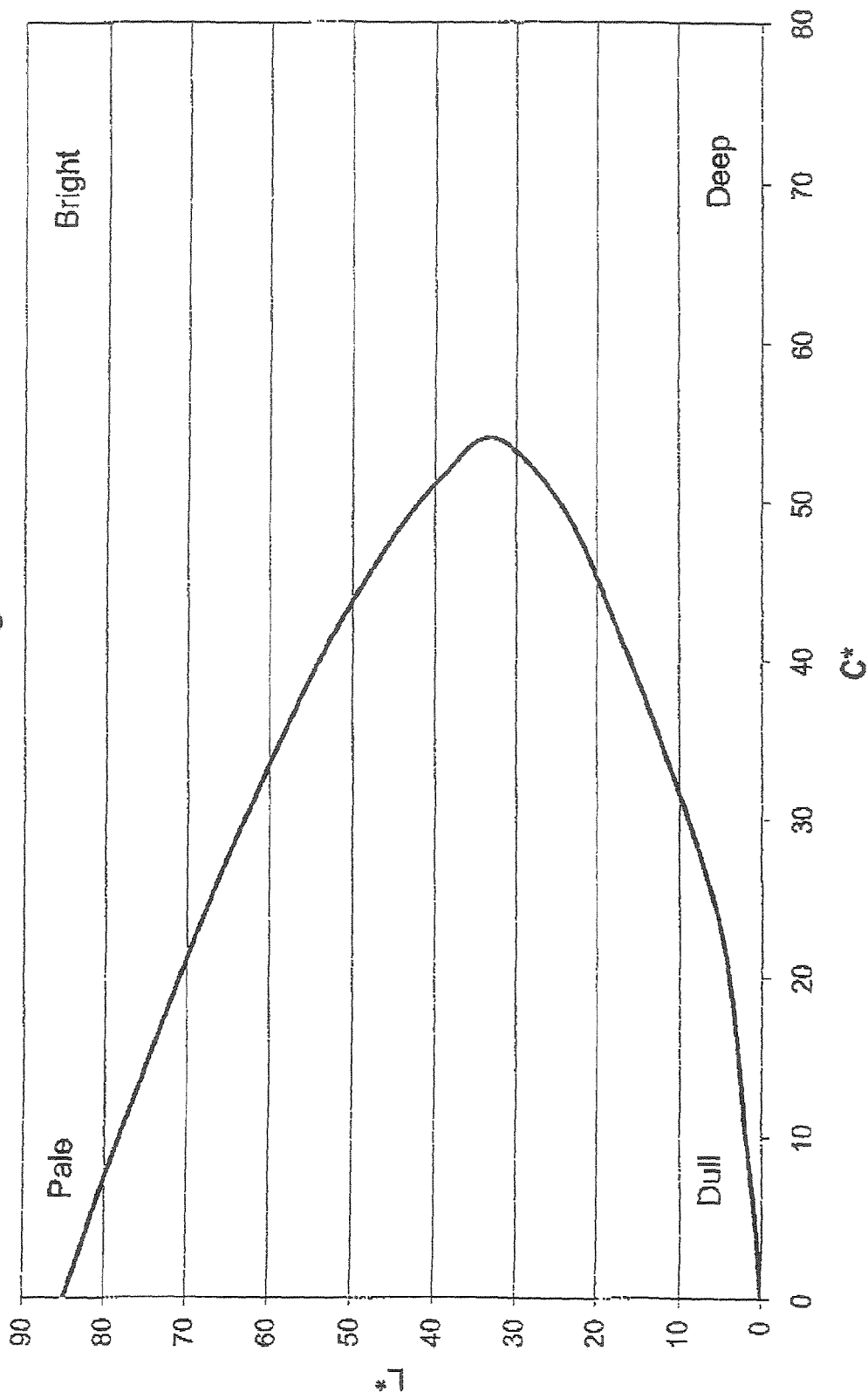

FIGS. 3 and 4 show respectively an a*b* plot and an L*C* plot derived, in the way discussed above, from the absorption spectrum of one of the 1.7 mm thick orangish brown CVD diamond layers (C). It can be seen that the L*C* curve runs between regions corresponding to pale, moderately bright, deep and finally dull. Although this layer had a pale tone, the optical properties of the diamond are such that thicker layers of such diamond, after skillfully polishing, can yield gemstones with a range of different possible tones and colours. This is illustrated by the polished gemstones of examples 1, 3 and 4 that were given colour grades of fancy light pink-brown, fancy dark orangish brown and fancy pink brown.

Figure 5:
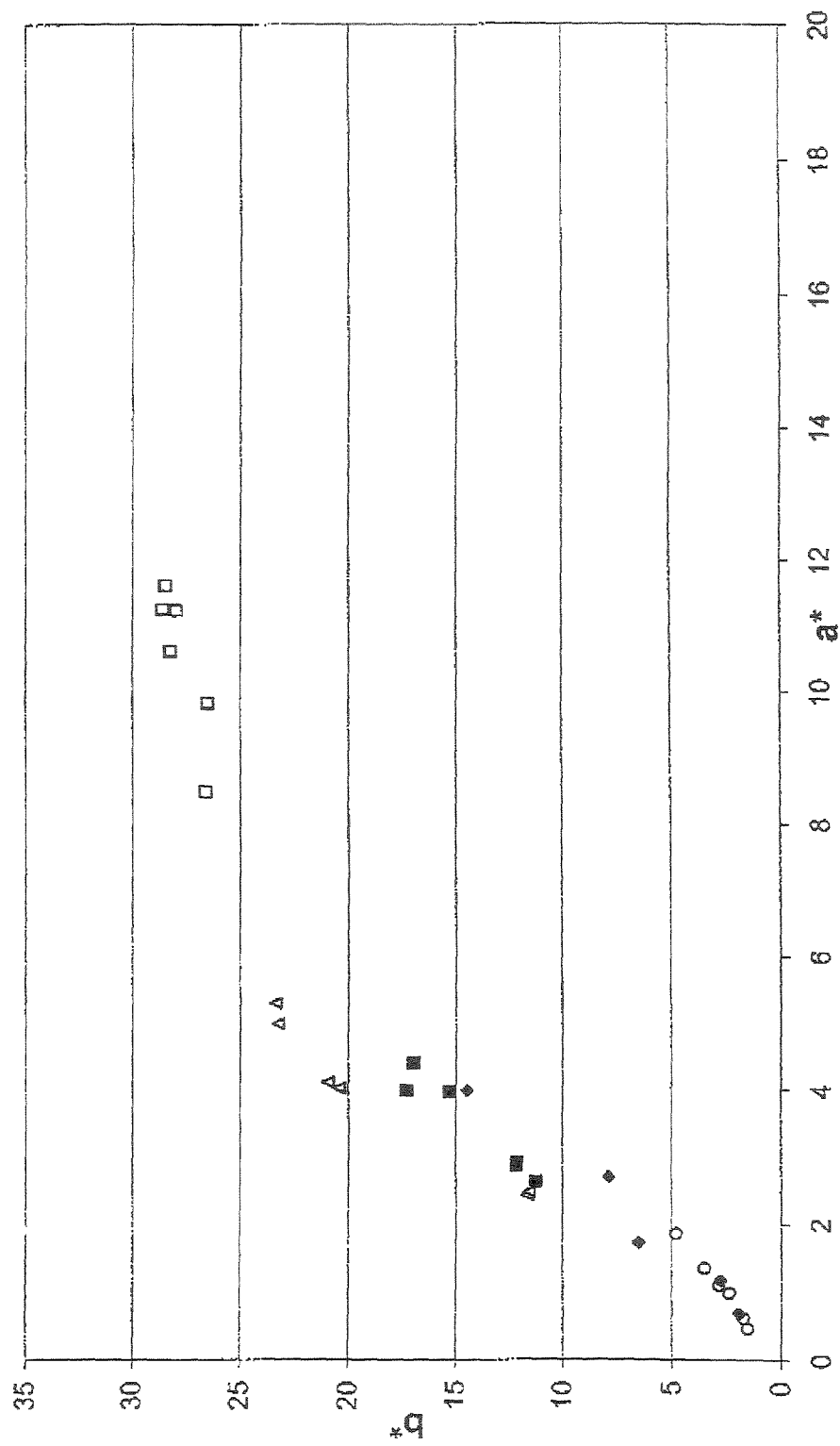
Figure 6:
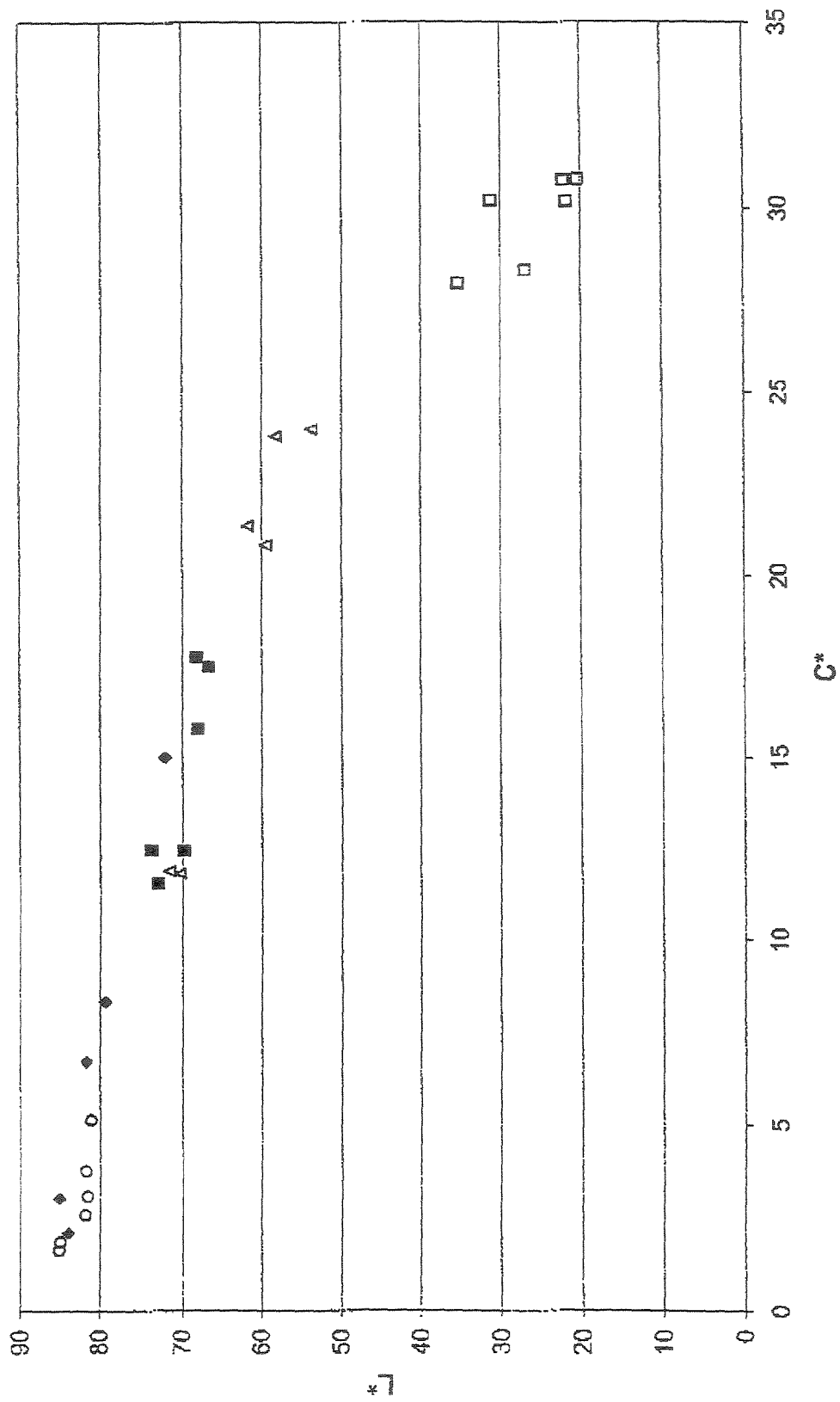

FIGS. 5 and 6 show CIELAB a*b* and L*C* plots for a range of samples of similar thickness. They show that significant variations in hue, saturation and lightness result from differences in growth conditions. Thus the CVD process can be adjusted to control the colour that will result for a polished stone of a given size and cut.

Collectors of natural fancy colour diamonds acknowledge that these are desirable colours. In his book "Collecting and Classifying Coloured Diamonds" (Ashland Press, New York, 1998), Stephen Hofer describes the Aurora Collection, one of the largest collections of natural fancy coloured diamonds. These diamonds are acknowledged to have desirable colours and amongst them here are several with colours similar to those which can be achieved in CVD synthetic diamond using the method of this invention. Some of these are listed below. In the two cases where the CIELAB data are given, the hue angles are very close to that for CVD synthetic diamond of this invention.

Table of Colour Descriptions of Selected Diamonds from the Aurora Collection

| Aurora no. | Colour | a* | b* | C* | L* | Hue angle (degrees) |
|---|---|---|---|---|---|---|
| 259 (topaz) | Light pinkish orangish brown | 5.1 | 11.1 | 12.2 | 70 | 65 |
| 231 (cinnamon) | Medium dark pinkish orangish brown | 8.3 | 18.3 | 20.1 | 43 | 66 |
| 48 (cinnamon) | Medium pinkish orangish brown | | | | | |
| 171 (cognac) | Dark orangish brown | | | | | |
| 130 (chestnut) | Very dark orangish brown | | | | | |
| 78 (cinnamon) | Medium-dark pinkish orangish brown | | | | | |

Luminescence

Although the colour of a diamond is principally dependent on its absorption spectrum, it can also be influenced by its luminescence properties. This may be particularly the case for certain viewing conditions. For example, the luminescence will have the greatest effect when the diamond is viewed from a small distance under illumination with light that contains a strong component in a wavelength range that excites the luminescence most efficiently.

The diamond of the present invention can show strong luminescence from nitrogen-vacancy colour centres. The neutral and negatively charged N-V centres have their zero-phonon lines at 575 nm and 637 nm, respectively, and have absorption band systems on the shorter wavelength side of these zero-phonon lines. Light of wavelengths within the range covered by these absorption bands can be absorbed by these colour centres and give rise to luminescence with a spectrum which is characteristic of these centres. The luminescence from the neutral N-V centre is predominantly orange. That from the negatively charged N-V centre is red.

The negatively charged N-V centre is a relatively strong absorber, giving rise to an absorption band system with a maximum at around 570 nm. Some of the energy absorbed at these centres is re-emitted as luminescence. In contrast, the neutral N-V centre has a very small effect on the absorption spectrum and the energy absorbed is typically converted to luminescence with a high efficiency.

N-V centres in the vicinity of an electron donor, such as single substitutional nitrogen, are negatively charged, while isolated N-V centres are neutral. The effect of a given concentration of N-V centres on the colour of a diamond therefore depends on the concentration and relative distribution of electron donors. For example, N-V centres in diamond containing a high concentration of N will contribute to the colour predominantly via absorption of light by negatively charged N-V centres with a smaller contribution coming from luminescence. In the case of diamond containing low concentrations of electron donors such as nitrogen, luminescence from neutral N-V centres can make a more important contribution.

Luminescence Measurement and Quantification

As a result of variations in the importance of non-radiative paths, luminescence properties of diamond samples cannot in general be deduced directly from the concentrations of the various contributing centres as determined by absorption spectroscopy. Quantitative luminescence properties of diamond samples can, however be specified by normalising the integrated intensities of relevant luminescence lines or bands relative to the integrated intensity of diamond Raman scattering (nominally at 1332 cm$^{-1}$) collected under the same conditions.

The table below lists the results of quantitative luminescence measurements made on a range of single crystal CVD diamond samples of the invention. In each case, the measurements were made after removal of the {100} substrate on which they were grown. The growth conditions favoured the formation of predominantly <100> sector diamond samples with uniform luminescence properties as judged by luminescence imaging. Any small additional sectors with different luminescence properties were removed before the measurements were made.

The luminescence was excited at 77K with a 300 mW 514 nm argon ion laser beam and spectra were recorded using a Spex 1404 spectrometer equipped with a holographic grating (1800 grooves/mm) and a Hamamatsu R928 photomultiplier. The data were corrected to allow for spectral response function of the spectrometer system, derived using a standard lamp with a known spectral output.

| Sample | Normalised I(575) | Normalised I(637) | I(637)/I(575) |
|---|---|---|---|
| 404 | 1.929 | 6.880 | 3.566 |
| 407 | 5.808 | 17.65 | 3.039 |
| 409 | 3.116 | 10.07 | 3.233 |
| 410 | 1.293 | 4.267 | 3.299 |
| 412 | 2.703 | 7.367 | 2.725 |
| 414 | 17.09 | 52.29 | 3.058 |
| 415 | 19.06 | 41.92 | 2.198 |
| 416 | 17.02 | 70.00 | 4.111 |
| 417 | 32.86 | 69.77 | 2.123 |
| 418 | 29.34 | 61.31 | 2.089 |
| 423 | 6.985 | 7.019 | 1.004 |
| 424 | 51.41 | 101.8 | 1.981 |
| 425 | 68.22 | 277.4 | 4.067 |
| 426 | 16.17 | 29.23 | 1.807 |

-continued

| Sample | Normalised I(575) | Normalised I(637) | I(637)/I(575) |
|---|---|---|---|
| 434 | 4.929 | 4.378 | 0.8883 |
| 435 | 0.4982 | 1.223 | 2.455 |
| 437 | 0.3816 | 0.2224 | 0.5828 |
| 439 | 4.24 | 2.891 | 0.6818 |
| 505 | 0.00954 | 0.04031 | 4.225 |
| 507c | 0.3455 | 2.347 | 6.793 |
| 507b | 0.106 | 0.03252 | 0.3068 |
| 511b | 4.611 | 4.211 | 0.9134 |
| 501 | 2.586 | 1.959 | 0.7577 |
| 512 | 7.282 | 7.686 | 1.055 |
| 515 | 0.01886 | 0.01932 | 1.024 |
| 520 | 0.1802 | 0.5421 | 3.008 |
| 521 | 0.0402 | 0.03197 | 0.7936 |
| 513 | 0.0243 | 0.01765 | 0.7240 |
| 509 | 25.22 | 13.87 | 0.5498 |
| 511c | 0.0371 | 0.01112 | 0.2997 |
| 513b | 1.091 | 1.262 | 1.155 |
| 513c | 0.1717 | 0.2224 | 1.295 |
| 513d | 1.992 | 0.7645 | 0.3836 |
| 510b | 0.3922 | 0.6963 | 1.775 |
| 510c | 0.1643 | 0.6268 | 3.815 |
| 510d | 1.091 | 0.6811 | 0.6238 |
| 514a | 126.6 | 56.57 | 0.4466 |
| 514b | 101.3 | 50.79 | 0.5012 |
| 514c | 141.6 | 67.83 | 0.4789 |

It is important for the production of high crystalline quality (as herein defined) thick single crystal CVD diamond with properties suitable for coloured gem stones that growth takes place on a diamond surface which is substantially free of crystal defects. In this context, defects primarily mean dislocations and micro cracks, but also include twin boundaries, point defects not intrinsically associated with the dopant N atoms, low angle boundaries and any other extended disruption to the crystal lattice. Preferably the substrate is a low birefringence type Ia natural, Ib or IIa high pressure/high temperature synthetic diamond or a CVD synthesised single crystal diamond.

The quality of growth on a substrate which is not substantially free of defects rapidly degrades as the layer grows thicker and as the defect structures multiply, causing general crystal degradation, twinning and renucleation.

The defect density is most easily characterised by optical evaluation after using a plasma or chemical etch optimised to reveal the defects (referred to as a revealing plasma etch), using for example a brief plasma etch of the type described below. Two types of defects can be revealed:

1) Those intrinsic to the substrate material quality. In selected natural diamond the density of these defects can be as low as $50/mm^2$ with more typical values being $10^2/mm^2$, whilst in others it can be $10^6/mm^2$ or greater.
2) Those resulting from polishing, including dislocation structures and microcracks forming chatter tracks along polishing lines. The density of these can vary considerably over a sample, with typical values ranging from about $10^2/mm^2$, up to more than $10^4/mm^2$ in poorly polished regions or samples.

The preferred low density of defects is such that the density of surface etch features related to defects, as described above, is below $5 \times 10^3/mm^2$, and more preferably below $10^2/mm^2$.

The defect level at and below the substrate surface on which the CVD growth takes place may thus be minimised by careful preparation of the substrate. Included here under preparation is any process applied to the material from mine recovery (in the case of natural diamond) or synthesis (in the case of synthetic material) as each stage can influence the defect density within the material at the plane which will ultimately form the substrate surface when preparation as a substrate is complete. Particular processing steps may include conventional diamond processes such as mechanical sawing lapping and polishing (in this application specifically optimised for low defect levels), and less conventional techniques such as laser processing or ion implantation and lift off techniques, chemical/mechanical polishing and both liquid and plasma chemical processing techniques. In addition, the surface $R_Q$ (root mean square deviation of surface profile from flat measured by stylus profilometer, preferably measured over 0.08 mm length) should be minimised, typical values prior to any plasma etch being no more than a few nanometers, i.e. less than 10 nanometers.

One specific method of minimising the surface damage of the substrate, is to include an in situ plasma etch on the surface on which the homoepitaxial diamond growth is to occur. In principle this etch need not be in situ, nor immediately prior to the growth process, but the greatest benefit is achieved if it is in situ, because it avoids any risk of further physical damage or chemical contamination. An in situ etch is also generally most convenient when the growth process is also plasma based. The plasma etch can use similar conditions to the deposition or diamond growing process, but with the absence of any carbon containing source gas and generally at a slightly lower temperature to give better control of the etch rate. For example, it can consist of one or more of:

(i) an oxygen etch using predominantly hydrogen with optionally a small amount of Ar and a required small amount of $O_2$. Typical oxygen etch conditions are pressures of $50\text{-}450 \times 10^2$ Pa, an etching gas containing an oxygen content of 1 to 4 percent, an argon content of 0 to 30 percent and the balance hydrogen, all percentages being by volume, with a substrate temperature 600-1100° C. (more typically 800° C.) and a typical duration of 3-60 minutes.

(ii) a hydrogen etch which is similar to (i) but where the oxygen is absent.

(iii) alternative methods for the etch not solely based on argon, hydrogen and oxygen may be used, for example, those utilising halogens, other inert gases or nitrogen.

Typically the etch consists of an oxygen etch followed by a hydrogen etch and then moving directly into synthesis by the introduction of the carbon source gas. The etch time/temperature is selected to enable remaining surface damage from processing to be removed, and for any surface contaminants to be removed, but without forming a highly roughened surface and without etching extensively along extended defects such as dislocations which intersect the surface and thus cause deep pits. As the etch is aggressive, it is particularly important for this stage that the chamber design and material selection for its components be such that no material is transferred by the plasma into the gas phase or to the substrate surface. The hydrogen etch following the oxygen etch is less specific to crystal defects rounding off the angularities caused by the oxygen etch which aggressively attacks such defects and providing a smoother, better surface for subsequent growth.

The surface or surfaces of the diamond substrate on which the CVD diamond growth occurs are preferably the {100}, {110}, {113} or {111} surfaces. Due to processing constraints, the actual sample surface orientation can differ from these ideal orientations up to 5°, and in some cases up to 10°, although this is less desirable as it adversely affects reproducibility.

It is also important in the method of the invention that the impurity content of the environment in which the CVO growth takes place is property controlled. More particularly, the diamond growth must take place in the presence of an atmosphere containing substantially no contaminants other than the intentionally added nitrogen which should be controlled to better than 500 parts per billion (as a molecular fraction of the total gas volume) or 5% in the gas phase, whichever is the larger, and preferably to better than 300 parts per billion (as a molecular fraction of the total gas volume) or 3% in the gas phase, whichever is the larger, and more preferably to better than 100 parts per billion (as a molecular fraction of the total gas volume) or 1% in the gas phase, whichever is the larger. Measurement of absolute and relative nitrogen concentration in the gas phase at concentrations as low as 100 ppb requires sophisticated monitoring equipment such as that which can be achieved, for example, by gas chromatography. An example of such a method is now described:

Standard gas chromatography (GC) art consists of: a gas sample stream is extracted from the point of interest using a narrow bore sample line, optimised for maximum flow velocity and minimum dead volume, and passed through the GC sample coil before being passed to waste. The GC sample coil is a section of tube coiled up with a fixed and known volume (typically 1 cm$^3$ for standard atmospheric pressure injection) which can be switched from its location in the sample line into the carrier gas (high purity He) line feeding into the gas chromatography columns. This places a sample of gas of known volume into the gas flow entering the column; in the art, this procedure is called sample injection.

The injected sample is carried by the carrier gas through the first GC column (filled with a molecular sieve optimised for separation of simple inorganic gases) and is partially separated but the high concentration of primary gases (e.g. $H_2$, Ar) causes column saturation which makes complete separation of, for example nitrogen difficult. The relevant section of the effluent from the first column is then switched into the feed of a second column, thereby avoiding the majority of the other gases being passed into the second column, avoiding column saturation and enabling complete separation of the target gas ($N_2$). This procedure is called "heart-cutting".

The output flow of the second column is put through a discharge ionisation detector (DID), which detects the increase in leakage current through the carrier gas caused by the presence of the sample. Chemical structure is identified by the gas residence time which is calibrated from standard gas mixtures. The response of the DID is linear over more than 5 orders of magnitude, and is calibrated by use of special calibrated gas mixtures, typically in the range of 10-100 ppm, made by gravimetric analysis and then verified by the supplier. Linearity of the DID can be verified by careful dilution experiments.

This known art of gas chromatography has been further modified and developed for this application as follows: The processes being analysed here are typically operating at 50-500×10$^2$ Pa. Normal GC operation uses the excess pressure over atmospheric pressure of the source gas to drive the gas through the sample line. Here, the sample is driven by attaching a vacuum pump at the waste end of the line and the sample drawn through at below atmospheric pressure. However, whilst the gas is flowing the line impedance can cause significant pressure drop in the line, affecting calibration and sensitivity. Consequently, between the sample coil and the vacuum pump is placed a valve which is shut for a short duration before sample injection in order to enable the pressure at the sample coil to stabilise and be measured by a pressure gauge. To ensure a sufficient mass of sample gas is injected, the sample coil volume is enlarged to about 5 cm$^3$. Dependent on the design of the sample line, this technique can operate effectively down to pressures of about 70×10$^2$ Pa. Calibration of the GC is dependent on the mass of sample injected, and the greatest accuracy is obtained by calibrating the GC using the same sample pressure as that available from the source under analysis. Very high standards of vacuum and gas handling practice must be observed to ensure that the measurements are correct.

The point of sampling may be upstream of the synthesis chamber to characterise the incoming gases, within the chamber to characterise the chamber environment, or downstream of the chamber.

The source gas may be any known in the art and will contain a carbon-containing material which dissociates producing radicals or other reactive species. The gas mixture will also generally contain gases suitable to provide hydrogen or a halogen in atomic form.

The dissociation of the source gas is preferably carried out using microwave energy in a reactor examples of which are known in the art. However, the transfer of any impurities from the reactor should be minimised. A microwave system may be used to ensure that the plasma is placed away from all surfaces except the substrate surface on which diamond growth is to occur and its mount (substrate carrier). Examples of a preferred mount materials are: molybdenum, tungsten, silicon and silicon carbide. Examples of preferred reactor chamber materials are stainless steel, aluminium, copper, gold and platinum.

A high plasma power density should be used resulting from high microwave power (typically 3-60 kW, for substrate carrier diameters of 25-300 mm) and high gas pressures (50-500×10$^2$ Pa, and preferably 100-450×10$^2$ Pa).

Using the above conditions it has been possible to produce thick high quality single crystal CVD diamond layers with a desirable fancy colour using nitrogen additions, calculated as molecular nitrogen, to the gas flow in the range 0.5 to 500 ppm. The range of nitrogen concentrations for which growth of fancy brown diamond is possible has a complex dependence on other parameters such as substrate temperatures pressure and gas composition.

Suitable conditions for synthesis of the material of the invention are best illustrated by way of example.

Example 1

Substrates suitable for synthesising single crystal CVD diamond of the invention may be prepared as follows:
i) Selection of stock material (type Ia natural stones and type Ib HPHT stones) was optimised on the basis of microscopic investigation and birefringence imaging to identify substrates which were free of strain and imperfections.
ii) Laser sawing, lapping and polishing to minimise subsurface defects using a method of a revealing plasma etch to determine the defect levels being introduced by the processing.
iii) After optimisation it was possible routinely to produce substrates in which the density of defects measurable after a revealing etch is dependent primarily on the material quality and is below 5×10$^3$/mm$^2$, and generally below 10$^2$/mm$^2$. Substrates prepared by this process are then used for the subsequent synthesis.

Figure 7:
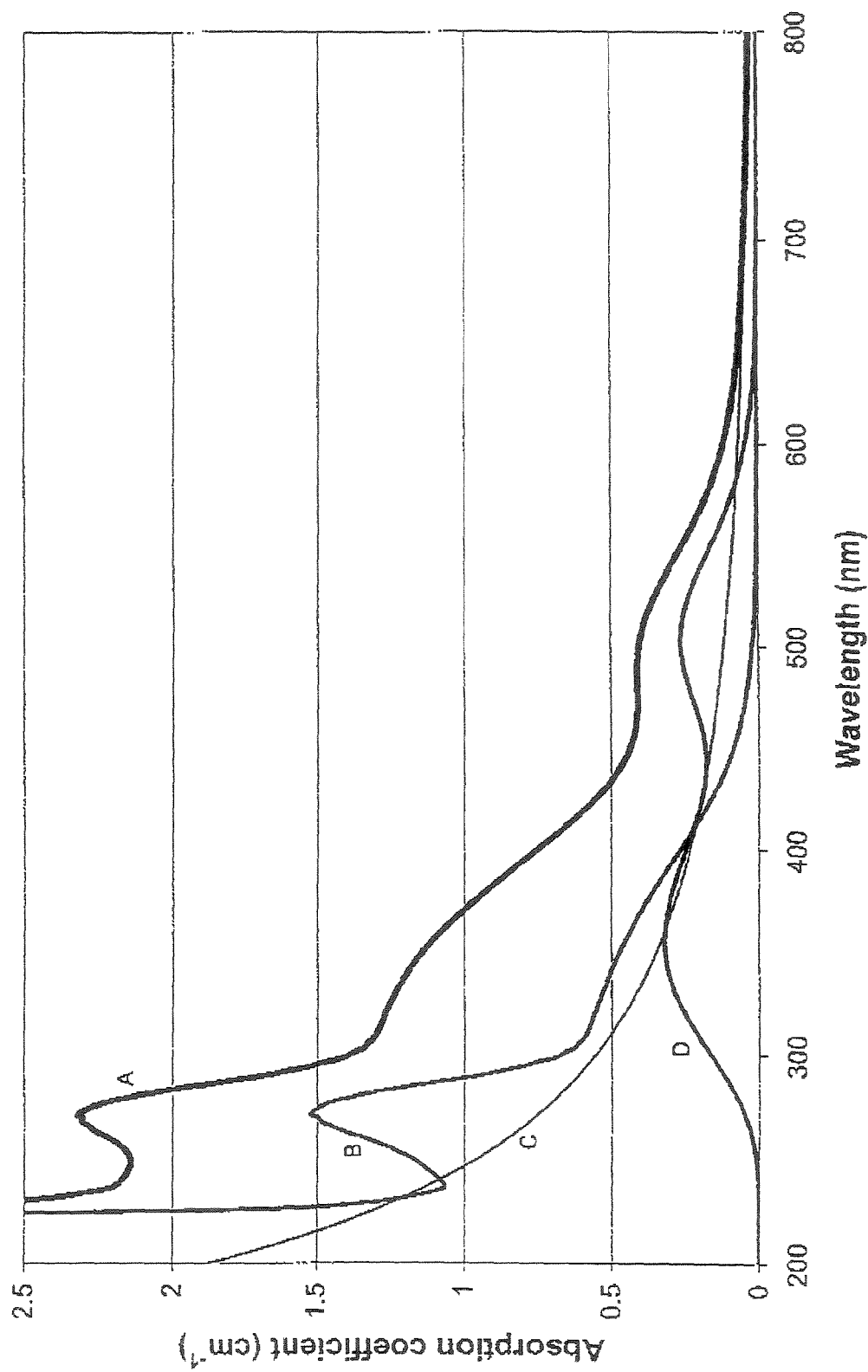
Figure 8:
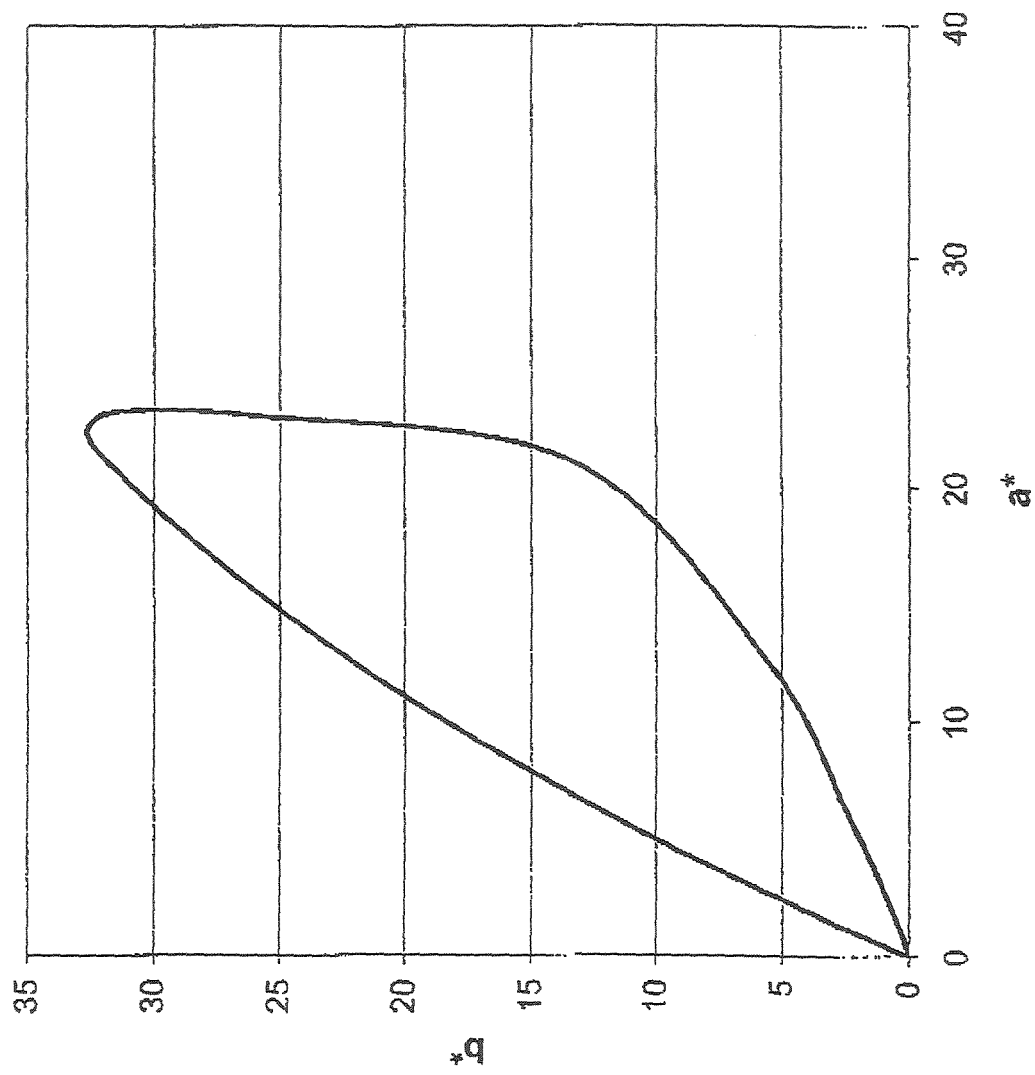
Figure 9:
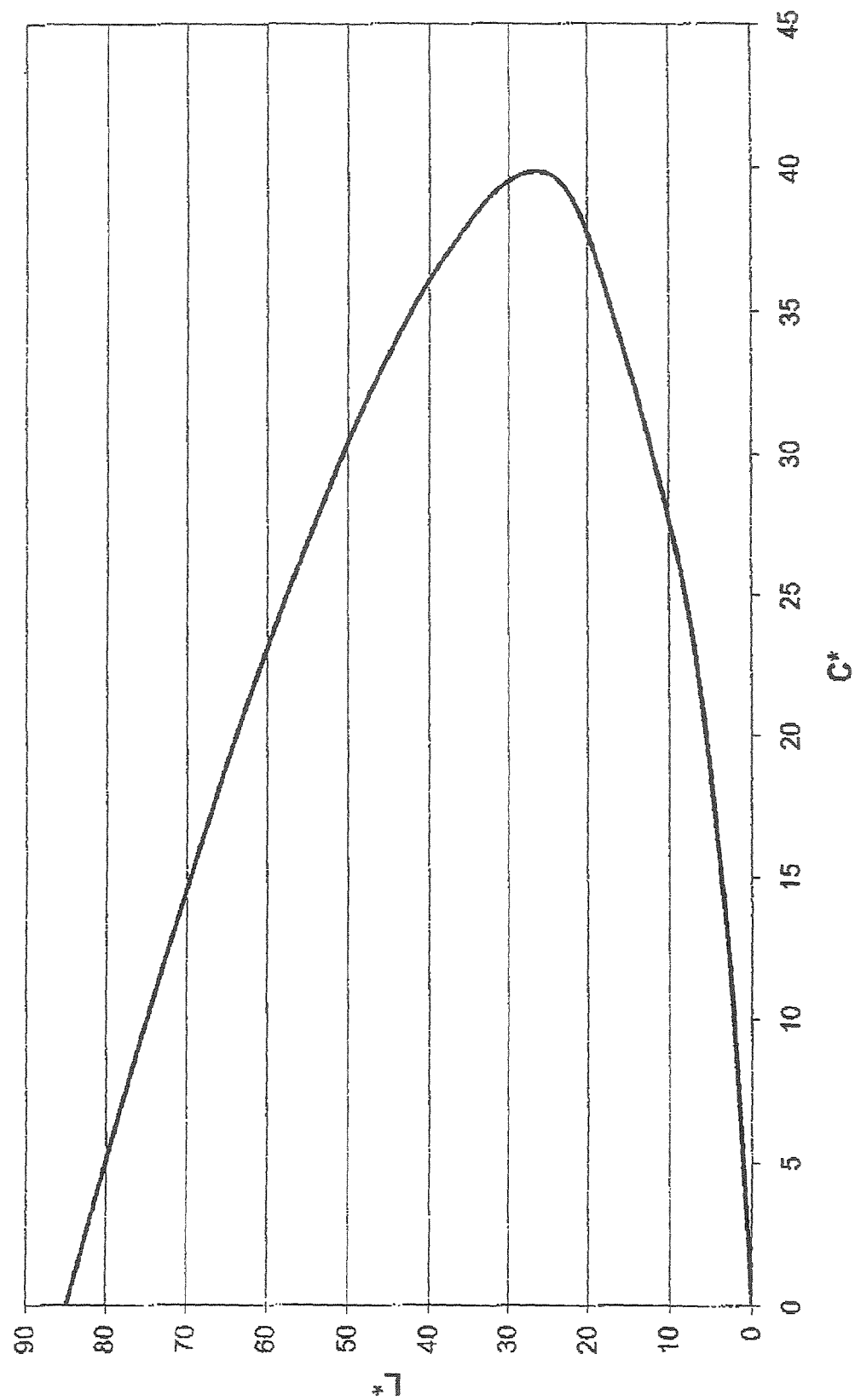
FIG. 9 CIELAB lightness saturation diagram for FN-1

A high temperature/high pressure synthetic type 1b diamond was grown in a high pressure press, and as a substrate using the method described above to minimise substrate defects to form a polished plate with lateral dimensions 5 mm×5 mm and thickness 500 μm, with all faces {100}. The surface roughness $R_Q$ at this stage was less than 1 nm. The substrate was mounted on a tungsten substrate using a high temperature diamond braze. This was introduced into a reactor and an etch and growth cycle commenced as described above, and more particularly:
1) The 2.45 GHz reactor was pre-fitted with point of use purifiers, reducing unintentional contaminant species in the incoming gas stream to below 80 ppb.
2) An in situ oxygen plasma etch was performed using 15/75/600 sccm (standard cubic centimetre per second) of $O_2$/Ar/$H_2$ at $263 \times 10^2$ Pa and a substrate temperature of 730° C.
3) This moved without interruption into a hydrogen etch with the removal of the $O_2$ from the gas flow.
4) This moved into the growth process by the addition of the carbon source (in this case $CH_4$) and dopant gases. In this instance was $CH_4$ flowing at 42 sccm and 3 ppm $N_2$ (calculated as $[N_2]$/[All gases] where $[N_2]$ represents the number of moles of $N_2$ and [All gases] represents the number of moles of all gases present) in the gas phase. The substrate temperature was 830° C.
5) On completion of the growth period, the substrate was removed from the reactor and the CVD diamond layer removed from the substrate.
6) This layer identified as FN-1, was then polished to produce a 6×6×3 mm square cut synthetic diamond with weight 1.1 carats and certified by a professional diamond grader to have a desirable fancy light pink brown colour and a quality grade of VS1.
7) FN-1 was further characterised by the data provided below:
i) An optical absorption spectrum showing the characteristic broad bands at 270 nm and approximately 355 nm and 510 nm. FIG. 7 shows the decomposition of the original spectrum (curve A) into a type Ib spectrum (curve B), a ramp component with a (wavelength)$^{-3}$ dependence (curve C) and the two overlapping bands centred at 355 and 510 nm (curve D). The peak 270 nm absorption coefficient of the type Ib component above a sloping baseline connecting the type Ib spectrum either side of the 270 nm peak, is 0.67 cm$^{-1}$. The (wavelengths)$^{-3}$ component and the 510 nm band contribute 0.11 cm$^{-1}$ and 0.21 cm$^{-1}$ respectively at 510 nm. The 355 m band contributes 0.32 cm$^{-1}$ at its peak. FIGS. 8 and 9 show CIELAB hue and tone diagrams respectively for diamond with the FN-1 absorption spectrum. The CIELAB coordinates derived from the absorption spectrum of FN-1 were as follows: a*=1.8, b*=3.9, L*=81, C*=4.3 and hue angle=65 degrees.
ii) Luminescence excited at 77 K with a 300 mW 514 nm Ar ion laser showing the zero phonon lines at 575 and 637 nm with Raman normalised intensities of 6.98 and 7.02 respectively.
iii) The EPR spectra showing single substitutional nitrogen with concentration 0.3 ppm.
iv) X-ray rocking curves map, showing the angular spread of the sample to be less than 20 arc sec.
v) Raman spectrum showing a line width (FWHM) to be 2 cm$^{-1}$.
vi) SIMS showed a total nitrogen concentration of 0.35 ppm Example 2

A 3.0 mm thick layer of CVD diamond was grown on a type Ib HPHT synthetic diamond substrate prepared in the same way as described in example 1 except with the following growth conditions:
(i) Etch temp of 718° C.
(ii) Growth conditions consisted of 32/25/600 sccm (standard cubic centimetre per second) of $CH_4$/Ar/$H_2$ at $180 \times 10^2$ Pa and a substrate temperature of 800° C. with 24 ppm added $N_2$.

After growth, the substrate was removed and the top and bottom surfaces of the were polished. UV/visible absorption spectra of the resulting CVD layer, designated FN-2, were recorded and analysed into the components discussed in the detailed description of the invention. The results are listed in the table below.

| Sample | 270 nm | 360 nm band | 510 nm band | Ramp |
|---|---|---|---|---|
| FN-2 | 1.35 cm$^{-1}$ | 1.05 cm$^{-1}$ | 0.55 cm$^{-1}$ | 0.31 cm$^{-1}$ |

The layer had a pale orangish brown colour and when the CIELAB coordinates were derived from the absorption spectrum, in the way described in the detailed description of the invention, the following results were obtained.

| Sample | a* | b* | C* | L* | Hue angle (degrees) |
|---|---|---|---|---|---|
| FN-2 | 1.9 | 4.8 | 5.2 | 81 | 69 |

Example 3

A 2.84 mm thick layer of CVD diamond was grown on a type Ib HPHT synthetic diamond substrate prepared in the same way as described in example 1 except with the following growth conditions:
(i) Etch temp of 710° C.
(ii) Growth conditions consisted of 42/25/600 sccm (standard cubic centimetre per second) of $CH_4$/Ar/$H_2$ at $420 \times 10^2$ Pa and a substrate temperature of 880° C. with 24 ppm added $N_2$.

The substrate was removed and resulting CVD layer, designated FN-3, was polished into a rectangular cut CVD gemstone of 1.04 carats which was certified by a professional diamond grader to have a desirable fancy dark orangey brown colour and a quality grade of SI1.

The luminescence excited at 77 K with a 300 mW 514 nm Ar ion laser showing the zero phonon lines at 575 and 637 nm with Raman normalised intensities of 27.7 and 44.1 respectively.

Example 4

A 3.53 mm thick layer of CVD diamond was grown on a type Ib HPHT synthetic diamond substrate prepared in the same way as described in example 1 except with the following growth conditions:
(i) Etch temp of 740° C.
(ii) Growth conditions consisted of 38/25/600 sccm (standard cubic centimetre per second) of $CH_4$/Ar/$H_2$ at $283 \times 10^2$ Pa and a substrate temperature of 860° C. with 21 ppm added $N_2$.

The substrate was removed and resulting CVD layer, designated FN-4, was polished into a rectangular cut CVD gemstone of 1.04 carats which was certified by a professional diamond grader to have a desirable fancy pink brown colour and a quality grade of SI3.

The luminescence excited at 77 K with a 300 mW 514 nm Ar ion laser showing the zero phonon lines at 575 and 637 nm with Raman normalised intensities of 15.26 and 21.03 respectively.

Example 5

A 1.7 mm thick layer of CVD diamond was grown on a type Ib HPHT synthetic diamond substrate prepared in the same way as described in example 1 except with the following growth conditions:
(i) Etch temp of 716° C.
(ii) Growth conditions consisted of 160/40/3000 sccm (standard cubic centimetre per second) of $CH_4/Ar/H_2$ at $260\times10^2$ Pa and a substrate temperature of 823° C. with 3.8 ppm added $N_2$.

After growth, the substrate was removed and the top and bottom surfaces of the CVD diamond layer were polished. A UV/visible absorption spectrum of the resulting CVD layer, designated FN-5, was recorded (spectrum C in FIG. 2) and analysed into the components discussed in the detailed description of the invention. The results are listed in the table below.

| Sample | 270 nm | 360 nm band | 510 nm band | Ramp |
|---|---|---|---|---|
| FN-5 | 1.60 cm$^{-1}$ | 2.0 cm$^{-1}$ | 0.80 cm$^{-1}$ | 0.60 cm$^{-1}$ |

The layer had a pale orangish brown colour and when the CIELAB coordinates were derived from the absorption spectrum, in the way described in the detailed description of the invention, the following results were obtained.

| Sample | a* | b* | C* | L* | Hue angle (degrees) |
|---|---|---|---|---|---|
| FN-5 | 2.7 | 7.9 | 8.3 | 79 | 71 |

We claim:

1. A diamond layer of single crystal CVD diamond which is coloured and which has a thickness greater than 1 mm, and in which the hue angle is less than 80 degrees.

2. A diamond layer according to claim 1 which has a fancy colour.

3. A diamond layer according to claim 2 wherein the colour is a fancy colour with a dominant brown component.

4. A diamond layer according to claim 1 wherein the colour is a fancy orangey brown, orange-brown, pinkish brown, pink-brown or dark brown.

5. A diamond layer according to claim 1 wherein the absorption at 510 nm is from 0.1 cm$^{-1}$-10 cm$^{-1}$.

6. A diamond layer according to claim 1 wherein the hue angle is less than 75 degrees.

7. A diamond layer according to claim 1 wherein the hue angle is less than 70 degrees.

8. A diamond layer according to claim 1 which has a thickness greater than 2 mm.

9. A diamond layer according to claim 1 which has a thickness greater than 3 mm.

10. A layer of single crystal CVD diamond according to claim 1 which has one or more of the characteristics (i), (ii), (iii) observable in the majority volume of the layer, which comprises at least 55 percent of the whole volume of the layer:
(i) The majority volume of the layer contains one or more defect and impurity related colour centres that contribute to the absorption spectrum of the diamond as set out in the absorption coefficient column below:

| Designation | Starts | Ends | Peak | Absorption coefficient (at peak) |
|---|---|---|---|---|
| 270 nm | 220 nm | 325 nm | 270 nm | 0.1 cm$^{-1}$-30 cm$^{-1}$ |
| 350 nm band | 270 nm | 450 nm | 350 nm | 0.3 cm$^{-1}$-20 cm$^{-1}$ |
| 510 nm band | 420 nm | 640 nm | 510 nm | 0.1 cm$^{-1}$-10 cm$^{-1}$ |
| 570/637 nm | 500 nm | 640 nm | 570 nm | 0.1 cm$^{-1}$-5 cm$^{-1}$ |

| Designation | Form of Curve | Absorption Coefficient |
|---|---|---|
| Ramp | Rising background of form Absorption coefficient (cm$^{-1}$) = C × $\lambda^{-3}$ (C = constant, $\lambda$ in μm) | Contribution at 510 nm is: <3 cm$^{-1}$ |

(ii) The majority volume of the layer contains defect and impurity related centres that contribute to the luminescence spectrum as set out in the Normalised luminescence intensity column of the table below, when measured in the manner described herein using Ar ion 514 nm laser excitation at 77 K:

| Designation | Starts | Ends | Peak | Normalised luminescence intensity of zero phonon line at 77 K |
|---|---|---|---|---|
| 575 nm | 570 nm | 680 nm | 575 nm | 0.02-80 |
| 637 nm | 635 nm | 800 nm | 637 nm | 0.01-300 |

(iii) The majority volume of the CVD diamond layer exhibits a ratio of normalised 637 nm/575 nm luminescence, measured in the manner described herein, which is in the range 0.2-10.

11. A diamond layer according to claim 10 wherein the majority volume comprises at least 80 percent of the whole volume of the layer.

12. A diamond layer according to claim 10 wherein the majority volume comprises at least 95 percent of the whole volume of the layer.

13. A diamond layer according to claim 10 wherein the majority volume of the layer is formed from a single growth sector.

14. A diamond layer according to claim 10 wherein the colour centre that contributes to the absorption spectrum of a diamond at 270 nm has the characteristics:

| Designation | Starts | Ends | Peak | Absorption coefficient (at peak) |
|---|---|---|---|---|
| 270 nm | 235 nm | 325 nm | 270 nm | 0.4 cm$^{-1}$-10 cm$^{-1}$. |

15. A diamond layer according to claim 10 wherein the colour centre that contributes to the absorption spectrum of a diamond at 270 nm has the characteristics:

| Designation | Starts | Ends | Peak | Absorption coefficient (at peak) |
|---|---|---|---|---|
| 270 nm | 235 nm | 325 nm | 270 nm | 0.8 cm$^{-1}$-6 cm$^{-1}$. |

16. A diamond layer according to claim 10 wherein the colour centre that contributes to the absorption spectrum of a diamond at 350 nm has the characteristics:

| Designation | Starts | Ends | Peak | Absorption coefficient (at peak) |
|---|---|---|---|---|
| 350 nm band | 270 nm | 450 nm | 350 nm | 1.0 cm$^{-1}$-8 cm$^{-1}$. |

17. A diamond layer according to claim 10 wherein the colour centre that contributes to the absorption spectrum of a diamond at 350 nm has the characteristics:

| Designation | Starts | Ends | Peak | Absorption coefficient (at peak) |
|---|---|---|---|---|
| 350 nm band | 270 nm | 450 nm | 350 nm | 1.5 cm$^{-1}$-6 cm$^{-1}$. |

18. A diamond layer according to claim 10 wherein the colour centre that contributes to the absorption spectrum of a diamond at 510 nm has the characteristics:

| Designation | Starts | Ends | Peak | Absorption coefficient (at peak) |
|---|---|---|---|---|
| 510 nm band | 420 nm | 640 nm | 510 nm | 0.2 cm$^{-1}$-4 cm$^{-1}$. |

19. A diamond layer according to claim 10 wherein the colour centre that contributes to the absorption spectrum of a diamond at 510 nm has the characteristics:

| Designation | Starts | Ends | Peak | Absorption coefficient (at peak) |
|---|---|---|---|---|
| 510 nm band | 420 nm | 640 nm | 510 nm | 0.4 cm$^{-1}$-2 cm$^{-1}$. |

20. A diamond layer according to claim 10 wherein the colour centre that contributes to the absorption spectrum of a diamond at 570/637 nm has the characteristics:

| Designation | Starts | Ends | Peak | Absorption coefficient (at peak) |
|---|---|---|---|---|
| 570/637 nm | 500 nm | 640 nm | 570 nm | 0.3 cm$^{-1}$-3 cm$^{-1}$. |

21. A diamond layer according to claim 10 wherein the colour centre that contributes to the absorption spectrum of a diamond at 570/637 nm has the characteristics:

| Designation | Starts | Ends | Peak | Absorption coefficient (at peak) |
|---|---|---|---|---|
| 570/637 nm | 500 nm | 640 nm | 570 nm | 0.3 cm$^{-1}$-1.5 cm$^{-1}$. |

22. A diamond layer according to claim 10 wherein the ramp has the characteristics:

| Designation | Form of Curve | Absorption coefficient (at peak) |
|---|---|---|
| Ramp | Rising background of form Absorption coefficient (cm$^{-1}$) = C × λ$^{-3}$ (C = constant, λ in μm). | Contribution at 510 nm is: <1.5 cm$^{-1}$ |

23. A diamond layer according to claim 10 wherein the ramp has the characteristics:

| Designation | Form of Curve | Absorption coefficient (at peak) |
|---|---|---|
| Ramp | Rising background of form Absorption coefficient (cm$^{-1}$) = C × λ$^{-3}$ (C = constant, λ in μm). | Contribution at 510 nm is: <0.8 cm$^{-1}$ |

24. A diamond layer according to claim 10 wherein the colour centre that contributes to the luminescence spectrum of a diamond at 575 nm has the characteristics:

| Designation | Starts | Ends | Peak | Normalised luminescence intensity of zero phonon line at 77K |
|---|---|---|---|---|
| 575 nm | 570 nm | 680 nm | 575 nm | 0.05-60. |

25. A diamond layer according to claim 10 wherein the colour centre that contributes to the luminescence spectrum of a diamond at 575 nm has the characteristics:

| Designation | Starts | Ends | Peak | Normalised luminescence intensity of zero phonon line at 77 K |
|---|---|---|---|---|
| 575 nm | 570 nm | 680 nm | 575 nm | 0.2-40. |

26. A diamond layer according to claim 10 wherein the colour centre that contributes to the luminescence spectrum of a diamond at 637 nm has the characteristics:

| Designation | Starts | Ends | Peak | Normalised luminescence intensity of zero phonon line at 77 K |
|---|---|---|---|---|
| 637 nm | 635 nm | 800 nm | 637 nm | 0.02-200. |

27. A diamond layer according to claim 10 wherein the colour centre that contributes to the luminescence spectrum of a diamond at 637 nm has the characteristics:

| Designation | Starts | Ends | Peak | Normalised luminescence intensity of zero phonon line at 77 K |
|---|---|---|---|---|
| 637 nm | 635 nm | 800 nm | 637 nm | 0.03-100. |

28. A diamond layer according to claim 10 wherein the ratio of normalised 637 nm/575 nm luminescence is in the range 0.5 to 8.

29. A diamond layer according to claim 10 wherein the ratio of normalised 637 nm/575 nm luminescence is in the range 2 to 5.

30. A diamond layer according to claim 1 produced by a method comprising providing a diamond substrate having a surface which is substantially free of crystal defects, providing a source of gas, dissociating the source gas to produce a synthesis atmosphere which contains 0.5 to 500 ppm nitrogen, calculated as molecular nitrogen, and allowing homoepitaxial diamond growth on the surface which is substantially free of crystal defects.

31. A gemstone produced from a diamond layer according to claim 1 or claim 30.

32. A gemstone according to claim 31 with a quality grading of SI1 or better.

33. A gemstone according to claim 31 with a quality grading of VS1 or better.

34. A diamond layer according to claim 1 wherein the absorption at 270 nm is from $0.1 \text{ cm}^{-1}\text{-}30 \text{ cm}^{-1}$.

35. A layer of single crystal diamond which is coloured and which has, observable in the majority volume of the layer wherein the majority volume comprises at least 55 percent of the whole volume of the layer, a low ramp as set out in the table below:

| Designation | Form of Curve | Absorption Coefficient |
| --- | --- | --- |
| Ramp | Rising background of form Absorption coefficient $(\text{cm}^{-1}) = C \times \lambda^{-3}$ (C = constant, $\lambda$ in $\mu$m) | Contribution at 510 nm is: $<3 \text{ cm}^{-1}$ | and wherein the majority volume contains one or more of the defect and impurity related colour centres that contribute to the absorption spectrum of diamond as set out in the absorption coefficient column of the table below:

| Designation | Starts | Ends | Peak | Absorption coefficient (at peak) |
| --- | --- | --- | --- | --- |
| 270 nm | 220 nm | 325 nm | 270 nm | $0.1 \text{ cm}^{-1}\text{-}30 \text{ cm}^{-1}$ |
| 350 nm band | 270 nm | 450 nm | 350 nm +/− 10 nm | $0.3 \text{ cm}^{-1}\text{-}20 \text{ cm}^{-1}$ |
| 510 nm band | 420 nm | 640 nm | 510 nm +/− 50 nm | $0.1 \text{ cm}^{-1}\text{-}10 \text{ cm}^{-1}$ |
| 570/637 nm | 500 nm | 640 nm | 570 nm | $0.1 \text{ cm}^{-1}\text{-}5 \text{ cm}^{-1}$. |

* * * * *